United States Patent [19]

Bach

[11] Patent Number: 4,760,292
[45] Date of Patent: Jul. 26, 1988

[54] TEMPERATURE COMPENSATED OUTPUT BUFFER

[75] Inventor: Randall E. Bach, Stillwater, Minn.

[73] Assignee: ETA Systems, Inc., St. Paul, Minn.

[21] Appl. No.: 925,698

[22] Filed: Oct. 29, 1986

[51] Int. Cl.$^4$ .................. H03K 17/14; H03K 17/16
[52] U.S. Cl. ............................ 307/475; 307/310; 307/443; 307/451
[58] Field of Search ............ 307/451, 475, 469, 476, 307/473, 310, 580, 200 B, 443, 310, 296.4, 296.6

[56] References Cited

U.S. PATENT DOCUMENTS

| | | | |
|---|---|---|---|
| 4,209,713 | 6/1980 | Satow et al. | 307/200 B |
| 4,514,646 | 4/1985 | Ando et al. | 307/200 B |
| 4,584,492 | 4/1986 | Sharp | 307/475 |
| 4,672,237 | 6/1987 | Kiyozuka | 307/310 |

*Primary Examiner*—Stanley D. Miller
*Assistant Examiner*—Richard Roseen
*Attorney, Agent, or Firm*—Kinney & Lange

[57] ABSTRACT

An integrated circuit with temperature compensated output buffers which are adapted for impedance matched coupling to transmission lines when operated at either room temperature or at a cryogenic temperature (e.g., immersed in liquid nitrogen). The output buffers include output terminals which are adapted to be coupled to the transmission lines. Output stages of the output buffers have an output impedance which is less than a characteristic impedance of the transmission lines, and are characterized by a temperature coefficient of resistance. Compensation resistors which have an impedance less than the characteristic impedance of the transmission lines, and are characterized by a relatively low temperature coefficient of resistance, couple the output stages to the output terminals.

12 Claims, 1 Drawing Sheet

TEMPERATURE COMPENSATED OUTPUT BUFFER

BACKGROUND OF THE INVENTION

1. Field of the Invention

The present invention relates to integrated circuit output buffers. In particular, the present invention is a temperature compensated output buffer which is adapted for impedance matched coupling to a transmission line at both room temperature and the cryogenic temperature of liquid nitrogen.

2. Description of the Prior Art.

Tri-state output buffers are well known circuit elements commonly found on integrated circuits. These output buffers are used to interface main logic or other signal processing circuitry on the integrated circuit to the device's output pins. When driven to its tri-state mode, an output buffer presents a very high output impedance at the output terminal, thereby electrically isolating the transmission line or output device to which the output terminal is coupled from the integrated circuit. When operated in its normal mode, the logic state of the output buffer will be controlled by the signal processing circuitry which it interfaces to the output pin. The output buffer provides these date signals at speeds and signal levels required by the output devices.

Known output buffers include an output stage formed by several transistors. The output impedance of output buffers of this type is essentially equal to the output impedance of the output stage. This output impedance, in turn, has a relatively large temperature coefficient of resistance since the resistance characteristics of the transistors are very sensitive to the ambient temperature in which they are operated.

It is well known that in order to properly couple an output signal from an output buffer to a transmission line or output device, it is required that the output impedance of the output buffer be equal to the characteristic impedance of the transmission line. While this is not a problem for output buffers which are adapted to operate at one temperature, it does present problems when the integrated circuit must be used at both room temperature, and immersed in liquid nitrogen as are some integrated circuits used in supercomputers. If the transistors forming the output stage are sized to have an output impedance which matches the transmission line when used at room temperature, the impedance of the output stage will drop drastically when immersed in liquid nitrogen. The result is an unacceptable impedance match between the output buffer and transmission line.

Clearly, there is a continuing need for improved output buffers. In particular, there is a need for an integrated circuit output buffer which can be impedance matched to a transmission line at both room temperature and the temperature of liquid nitrogen. This output buffer must of course be relatively simple and inexpensive to manufacture.

SUMMARY OF THE INVENTION

The present invention is an integrated circuit output buffer adapted for impedance matched coupling at a first temperature and at a second lower temperature to a transmission line having a characteristic impedance. The output buffer includes an output terminal, an output stage, and a compensation resistor. The output stage has a first output impedance at the first temperature, and a second lower output impedance at the second temperature. The compensation resistor has a low temperature coefficient of resistance, and couples the output stage to the output terminal.

In preferred embodiments, the output stage includes a plurality of CMOS transistors. The compensation resistor can be fabricated of polysilicon material, which has a low temperature coefficient of resistance. In one described embodiment, a sum of the output impedance of the output stage and compensation resistor is within 20% of the characteristic impedance of the transmission line at both the first and second temperatures.

The output buffer of the present invention is well suited for use on integrated circuit chips such as those used in supercomputers which must be operated at both room temperature and the 77° K. temperature of liquid nitrogen. The compensation resistor is easily and inexpensively fabricated on the integrated circuit during manufacture.

DETAILED DESCRIPTION OF THE PREFERRED EMBODIMENTS

Figure 1:
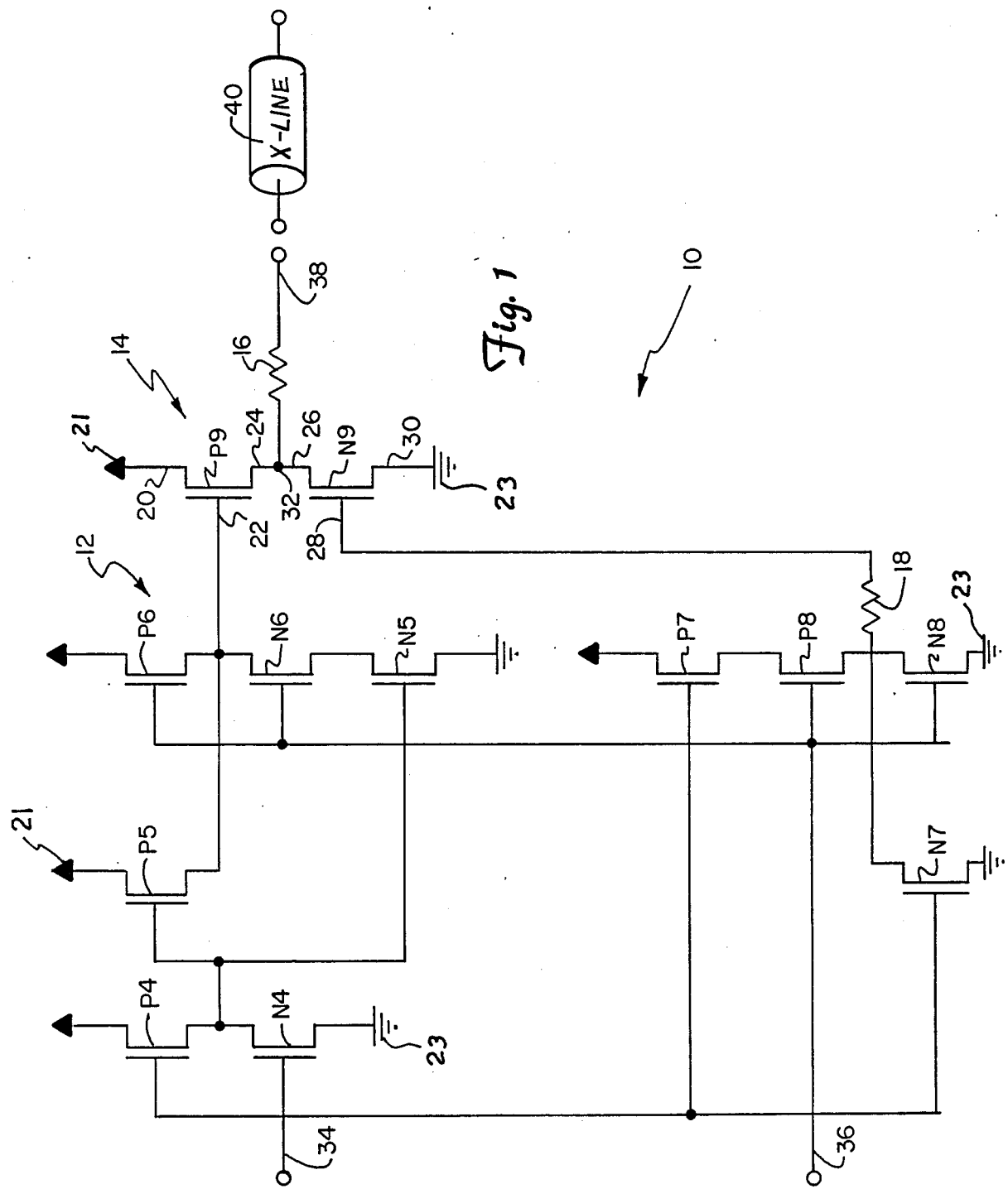
FIG. 1 is a schematic diagram of a tri-state output buffer in accordance with the present invention.

A temperature compensated output buffer 10 in accordance with the present invention is illustrated generally in FIG. 1. Output buffer 10 will typically be one of a plurality of similar output buffer fabricated on an integrated circuit. Each output buffer drives an output pin of the integrated circuit in response to data and/or control signals provided by logic or other circuitry (not shown) also fabricated on the integrated circuit. Output buffer 10 can be acceptably impedance matched to transmission line 40 or other output device when the integrated circuit is operated at room temperature, or immersed in liquid nitrogen.

In the embodiment illustrated in FIG. 1, output buffer 10 is a CMOS tri-state buffer which includes predriver 12, a driver or output stage 14, and compensation resistor 16. Predriver 12 is formed by p-channel enhancement mode transistors P4–P8, n-channel enhancement mode transistors N4–N8, and resistor 18. Output stage 14 is formed by p-channel enhancement mode transistor P9, and n-channel enhancement mode transistor N9. Transistor P9 has a source 20, gate 22, and drain 24. Transistor N9 has a drain 26, gate 28, and source 30. Drains 24 and 26 of transistors P9 and N9, respectively, are coupled together at node 32. Source 20 of transistor P9, as well as the sources of transistors P4–P7, are connected to receive a relatively positive supply potential from a first supply terminal 21. Source 30 of transistor N9, and the sources of transistors N4, N5, N7, and N8 are connected to receive a relatively negative supply potential such as ground 23.

Output buffer 10 will receive a tri-state control signal at tri-state control terminal 34, and a data signal at data terminal 36, from the logic circuitry to which it is connected. The operation of tri-state output buffers such as that illustrated at 10 is well known. When the tri-state control signal has a first (e.g., HIGH) logic state, output buffer 10 is disabled or "tri-stated", causing the output buffer to have a very high output impedance at output terminal 38. Output buffer 10 and the logic circuitry which it interfaces to output terminal 38 are thereby electrically disconnected or floating with respect to any devices to which the output terminal is connected. When the tri-state control signal has a second (e.g., LOW) logic state, the logic state of the output signal at node 32, and therefore output terminal 38, is controlled by the logic state of the data signal applied to data terminal 36. For example, when the tri-state control signal has a second logic state, output terminal 38 will be switched to a LOW logic state when data terminal 36 is driven with a LOW data signal, and be switched to a HIGH logic state when the data signal has a HIGH logic state.

In response to the tri-state control and data signals, predriver 12 provides proper drive signals to gates 22 and 28 of transistors P9 and N9, respectively, of output stage 14. Transistors P9 and N9 of output stage 14 are also larger in size than those of predriver 12, to enable transistors P9 and N9 to sink or source the current levels which are needed to interface the output buffer to output devices. Signals provided by predriver 12 to transistors P9 and N9 are also of a level sufficient to drive transistors of this size at the required speeds.

When output buffer 10 is not tri-stated, only one of transistors P9 and N9 will be switched to its ON state at any given time. To present a HIGH logic state at output terminal 38, transistor P9 is switched ON while transistor N9 is switched OFF. Current from first supply terminal 21 is thereby sourced through transistor P9 and resistor 16 to output terminal 38. To present a LOW logic state at output terminal 38, transistor P9 is switched OFF while transistor N9 is switched ON. Current through output terminal 38 is thereby sunk through resistor 16 and transistor N9 to ground 23.

When an integrated circuit which includes an output buffer 10 is used in a data processing device (such as a computer), output terminal 38 will be coupled to some type of output device which is adapted to receive the output signal. Typically, this coupling is made through a transmission line (X-line) such as that illustrated at 40 in FIG. 1. Transmission line 40 is characterized by a characteristic impedance. Transmission lines having a characteristic impedance of 50 ohms are common, and this value will be used for purposes of example in subsequent portions of this specification. It is well known that in order to properly couple an output signal from output buffer 10 to transmission line 40 without loss of power, timing errors or other detrimental effects, output buffer 10 must have an output impedance, as seen from output terminal 38, which is equal to the characteristic impedance of transmission line 40.

As previously described in the Background of the Invention section, it is sometimes necessary to have integrated circuits which can operate at the 77° K. temperatures of liquid nitrogen as well as at room temperature which is approximately 293° K. However, in output buffers which do not include a compensation resistor 16, the output impedance will be equal to the output impedance of the output stage of the buffer. The output impedance of the output stage 14, as seen at node 32, is determined primarily by the impedance of the channel region (not separately shown) of whichever transistor P9 and N9 is switched to its ON state. The channel regions of CMOS transistors such a P9 and N9 are fabricated of semiconductor material such as standard silicon, which has a relatively large temperature coefficient of resistance with respect to many substances such as polysilicon. The temperature coefficient of resistance of output buffer 14, therefore, is essentially equal to the temperature coefficient of resistance of individual transistors P9 and N9.

The impedance or resistance of the channel regions of transistors P9 and N9 is determined as a function of the ratio of the width to the length of the semiconductor material from which it is formed. If, for example, transistors P9 and N9 are fabricated with channel regions sized to have an impedance of 50 ohms at room temperature, the output impedance of output stage 14 will decrease to approximately 30 ohms when the integrated circuit is operated at the 77° K. temperature of liquid nitrogen. For this 216° temperature drop, the output impedance of output stage 14 will drop approximately 20 ohms or 40.0% of its room temperature value. This amounts to a thermal coefficient of resistance of approximately 0.093 ohms per °K. The impedance mismatch between an output buffer having an output impedance of 30 ohms at the temperature of liquid nitrogen, and the 50 ohm characteristic impedance of transmission line 40 at room temperature, is unacceptable.

To overcome these impedance matching problems, the present invention includes a compensation resistor 16 coupled between node 32 of output buffer 14 and output terminal 38. Compensation resistor 16 is fabricated of material such as polysilicon which has a relatively low thermal coefficient of resistance compared to that of output stage 14. The channel regions of transistors P9 and N9 forming output buffer 14 are accordingly sized so as to have a lower impedance at room temperature than they would were compensation resistor 16 not included. The temperature dependence of the output impedance of output buffer 10 is thereby reduced since a portion of the output impedance, that provided by compensation resistor 16, is relatively temperature insensitive. The variations in impedance of output buffer 14 caused by a reduction in the resistance of the channel region of transistors P9 or N9 when output buffer 10 is immersed liquid nitrogen is therefore less of a factor in the overall output impedance. The output impedance is a sum of the output impedance of output stage 14 (i.e., the impedance of the channel regions of whichever transistor P9 or N9 is switched ON) and the impedance of compensation resisistor 16.

In one embodiment of output buffer 10, compensation resistor 16 is fabricated of polysilicon and has a resistance of 30 ohms at room temperature. Due to the polycrystaline structure characteristics of polysilicon, its temperature coefficient of resistance is relatively low as compared to that of the channel regions of transistors P9 and N9. Its resistance will drop from 30 ohms at room temperature to approximately 29 ohms at the 77° K. temperatures of liquid nitrogen. This is a resistance change of approximately 1 ohm or 3.3% over this 216° temperature range. This amounts to a thermal coefficient of resistance of approximately 0.005 ohms per °K.

In this embodiment of output buffer 10, the channel regions of transistors P9 and N9 are sized so as to have an impedance of approximately 30 ohms at room temperature. The impedance of these devices will decrease to approximately 18 ohms at the 77° K. temperature of liquid nitrogen.

Since the output impedance of temperature compensated output buffer 10 is essentially equal to the sum of the output impedance of output stage 14 and the impedance of compensation resistor 16, the output buffer will have an output impedance of 60 ohms at room temperature, and 47 ohms at the 77° K. temperature of liquid nitrogen. The output impedance of output buffer 10 is therefore within 20% of the characteristic impedance of transmission line 20 throughout the temperature range in which the output buffer is required to operate. Although the impedance match at neither temperature is perfect, the match is acceptable at both.

Although the present invention has been described with reference to preferred embodiments, workers skilled in the art will recognize that changes may be made in form and detail without departing from the spirit and scope of the invention.

What is claimed is:

1. An integrated circuit output buffer adapted for impedance matched coupling at a first temperature and at a second lower temperature to a transmission line having a characteristic impedance at the the first temperature, including:
    an output terminal adapted to be coupled to the transmission line;
    an output stage having a first output impedance at the first temperature and a second lower output impedance at the second temperature; and
    compensation resistor means having impedances at the first and second temperatures and a low temperature coefficient of resistance, for coupling the output stage to the output terminal, the sum of the impedance of the compensation resistor means and the output impedance of the output stage at both the first and second temperatures being acceptably matched to the characteristic impedance of the transmission line.

2. The output buffer of claim 1 wherein the output stage includes a plurality of transistors interconnected to form a circuit.

3. The output buffer of claim 2 wherein the transistors include CMOS transistors.

4. The output buffer of claim 1 wherein the compensation resistor means is fabricated of polysilicon.

5. The output buffer of claim 1 wherein a sum of the output impedance of the output stage and an impedance of the compensation resistor means is within 20% of the characteristic impedance of the transmission line at both the first and second temperatures.

6. The output buffer of claim 1 wherein the buffer comprises a tri-state output buffer.

7. An integrated circuit output buffer adapted for impedance matched coupling at a first temperature and a second lower temperature to a transmission line having a characteristic impedance at the first temperature, including:
    an output terminal adapted to be coupled to the transmission line;
    an output stage having an output impedance less than the characteristic impedance of the transmission line and characterized by a relatively high temperature coefficient of resistance; and
    compensation resistor means having an impedance less than the characteristic impedance of the transmission line and characteristic by a relatively low temperature coefficient of resistance with respect to that of the ouptut stage, for coupling the output stage to the output terminal, the sum of the output impedance of the output stage and the impedance of the compensation resistor means at both the first and second temperatures being acceptably matched to the characteristic impedance of the transmission line.

8. The integrated circuit of claim 7 wherein the output stage includes a plurality of transistors interconnected to form a circuit.

9. The integrated circuit of claim 8 wherein the transistors include CMOS transistors.

10. The integrated circuit of claim 7 wherein the compensation resistor means is fabricated of polysilicon.

11. The integrated circuit of claim 7 wherein a sum of the output impedance of the output stage and the impedance of the compensation resistor means is within 20% of the characteristic impedance of the transmission line at both the first and second temperatures.

12. The integrated circuit of claim 7 wherein the output buffer comprises a tri-state output buffer.

* * * * *